Feb. 18, 1969

A. MIKA 3,427,715

PRINTED CIRCUIT FABRICATION

Filed June 13, 1966

INVENTOR
ABRAHAM MIKA
BY
Mueller, Aichele & Rauner
ATTYS.

United States Patent Office
3,427,715
Patented Feb. 18, 1969

3,427,715

PRINTED CIRCUIT FABRICATION

Abraham Mika, Scottsdale, Ariz., assignor to Motorola, Inc., Franklin, Park, Ill., a corporation of Illinois Filed June 13, 1966, Ser. No. 556,957
U.S. Cl. 29—626 8 Claims
Int. Cl. H05k 3/30, 1/16; H02b 1/04

ABSTRACT OF THE DISCLOSURE

A printed circuit board having layered conductors thereon on one side with electrical components mounted on the opposite side has at least one groove scribed therein along the line. The assembly is partially immersed in a solder bath which heats the thermoplastic material of the printed circuit board along the groove to a high degree of pliancy. The board is removed and then bent along the groove to form a nonplanar compact assembly. Upon cooling, the thermoplastic material returns to its normal rigidity. An epoxy adhesive may be included along the bend for added rigidity.

This invention relates to electrical printed circuit type modules having components mounted on a sheet-like substrate with layered or flat (such as etched) electrical conductors interconnecting the components and especially to methods of fabricating compact modules and the resulting articles of manufacture.

The so-called printed circuits, formed on a planar insulating board, have flat conductors usually formed by selectively etching away portions of a conductive sheet adhesively mounted on the board. Electrical components are mounted on the board through holes and are soldered to the board conductor patterns. The conductor patterns and components may appear on either or both sides of the board. When components are all mounted on one side and the conductor pattern is on the other, automatic fluxing and soldering machines are used to quickly and easily make the electrical connections.

A planar or flat board facilitates the assembly of components in that access to the board is relatively easy. Accordingly, most printed circuit modules are of the planar or flat board type. In complex electronic systems space requirements are becoming more and more stringent. The electrical component density available with planar or board type printed circuits is limited. Such circuit or component density may be increased by folding the printed circuit board into a U-shaped channel or other non-planar geometric configuration.

Previous attempts at increasing the component density in electronic circuits includes preforming a printed circuit board to the desired shape. For such preformed boards assembly costs are increased because of the difficulty of attaching the components and of soldering the components to the board conductor patterns. Alternatively there have been provided an assembly of several small flat printed circuit boards affixed together to form channels, boxes and other geometric shapes. Such an approach is not entirely satisfactory as it introduces additional connections between the small printed circuit boards within the module. The approach also increases the assembly cost by introducing the additional step as assembling together the several small boards.

Accordingly, it is an object of this invention to provide a low cost and simple method of facilitating assembly of electrical components onto an insulating support to provide a circuit module having a component density greater than a flat printed circuit board.

In practicing this invention, a sheet-like substrate (printed circuit board) having the characteristics of becoming pliant at elevated temperatures is first cut to size. Then grooves are selectively formed in the substrate along all lines at which it is desired to bend the substrate to form a non-planar configuration, such as a box shape, U-channel, etc. On the face of the board, opposite from each of the grooves there are formed flat conductor patterns which are the usual electrical connections on a printed circuit board. According to this invention such flat conductors add rigidity to the substrate when it is being bent along the formed groove at an elevated temperature. The flat conductors should have a substantial thickness in order to prevent separation of the conductor from the insulating substrate during bending. Such conductors also prevent the pliant substrate at its reduced thickness portion along the groove from tearing or otherwise breaking or separating from itself.

Referring now to the accompanying drawing.

Figures 1, 2, 3, 4, 5, 6, 7:
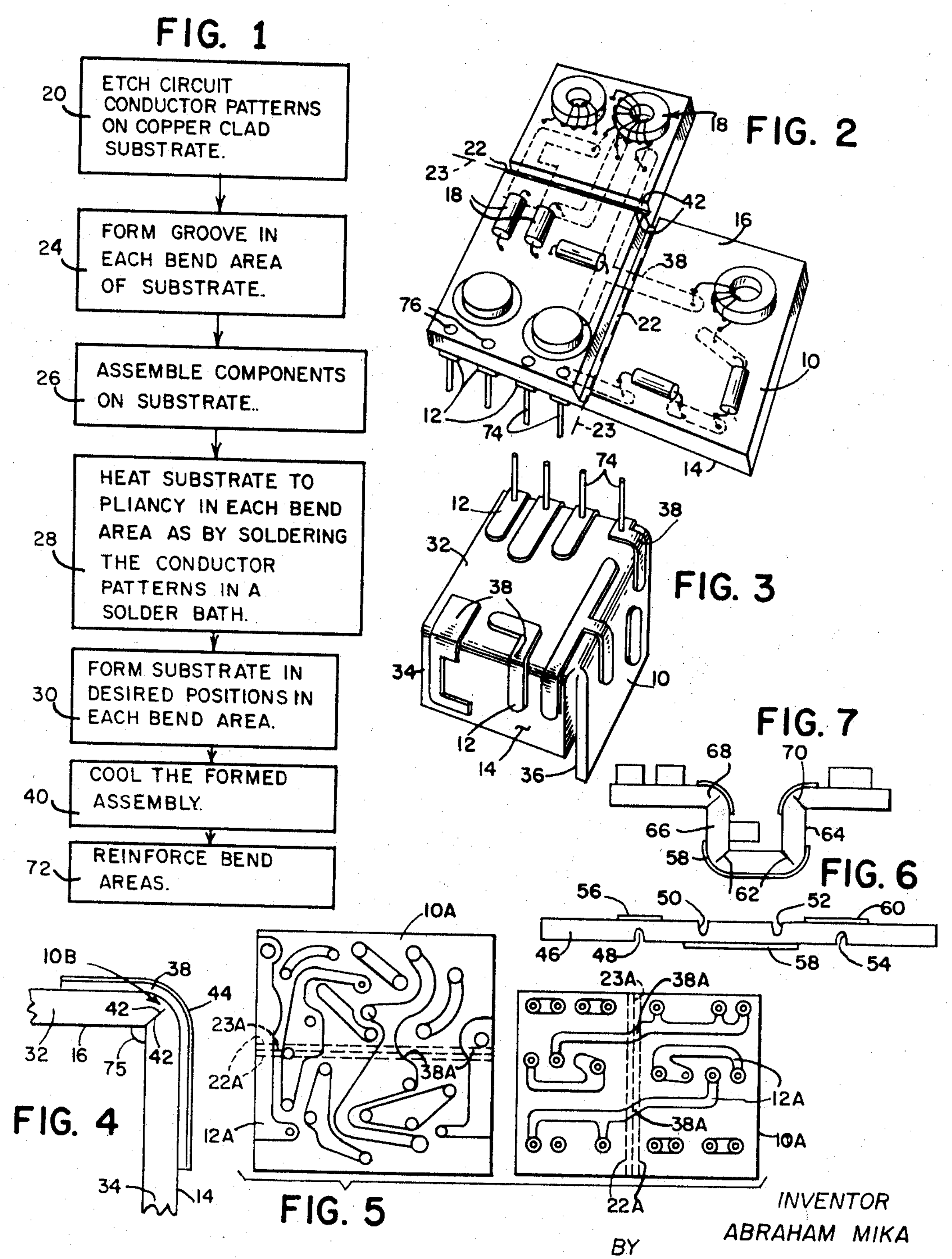
FIG. 1 is a process flow chart illustrating the preferred method of this invention.
FIG. 2 is a perspective view of a grooved planar insulating substrate having electrical components mounted thereon just prior to a soldering and reforming operation.
FIG. 3 is a perspective view of the FIG. 2 apparatus after being reformed into a non-planar more compact circuit module and showing the conductor patterns in the bend areas.
FIG. 4 is an enlarged partial end view of an exemplary bend formed in a printed circuit board according to the teachings of this invention.
FIG. 5 illustrates two etched circuit conductor patterns as may be used on printed circuit boards processed according to this invention.
FIGS. 6 and 7 are schematic diagrams of an alternate embodiment of the invention illustrated to demonstrate the versatility of the invention.

A suitable substrate preferably having a laminated conductive sheet attached thereto is first selected. Such a substrate preferably includes a thermoplastic type of resin which when subjected to elevated temperatures would tend to become pliant and when cooled to a normal or reduced temperature it again regains its normal rigidity. The etched conductor pattern on the substrate may be formed from the conductive sheet in any usual manner. The formation of conductor patterns on the substrate is not pertinent to the present invention. Such insulating substrates are normally provided with holes for receiving leads of electrical components, which leads extend through the substrate to make electrical contact with the conductors on the reverse side. No limitation to such construction is intended.

After the substrate has been selected and the conductor patterns have been formed on the substrate, the elongated grooves are formed in the substrate along the lines on which it is intended that the substrate will be bent in order to increase component density. Electrical components are then mounted on the substrate while it is still flat.

The conductor patterns are then soldered to the component leads, as by the well-known method of solder dipping in a solder bath. The heat from the solder bath quickly heats the substrate making it pliant. Since the thickness of the substrate in the area of the grooves is less than elsewhere, the substrate will become pliant first along the grooves.

It is to be understood that the solder bath may either be hand operated or be performed in an automatic fluxing and soldering machine. Alternatively a hand soldering iron could be used along the groove to solder and heat the substrate along the grooves to make such portions pliant.

After the substrate is suitably heated, it is removed from the solder bath and immediately bent along the formed grooves to form a non-planar module. It is preferred that the solder be allowed to cool somewhat so that it will be solidified before the bending operation. During the bending operation the heated substrate remains pliant in the reduced thickness areas and therefore is not subject to tearing or separating. Rigidity is added to the reduced thickness or bend area during pliancy by the conductor patterns extending crosswise of the formed grooves. The substrate is preferably bent such that opposing walls in the groove touch to make a strong bend. The substrate is then allowed to cool.

Additional strength may be added to the compact circuit module after cooling by applying a suitable adhesive, such as an epoxy adhesive, along the inner portion of the bend. The epoxy is adhesive and particularly advantageous when the substrate is a glass epoxy type of board. If other types of thermoplastic resin or other material are used in the substrate, then correspondingly different adhesives are preferably applied to the bent portion for increasing the strength.

Paying particular attention now to the accompanying drawing, like numbers indicate like parts and structural features as shown in the various views. The FIG. 1 flow chart will be referred to while describing the preferred method of fabricating the structures illustrated in FIGS. 2, 3 and 4.

A suitable printed circuit board or substrate 10 having the characteristic that it becomes pliant at elevated temperatures is chosen as the circuit module support base. For example, epoxy-glass board, type G–10 manufactured to NEMA specification FR–45, is commercially available and is suitable for use as a substrate in practicing this invention. Such a substrate may consist of a glass mat impregnated with a suitable thermoplastic epoxy resin, then to form the board it is subjected to a process of heat and pressure. A typical thickness of substrate board 10 is approximately 1/64 inch. Flat or layered conductors 12 are suitably formed on side 14 of substrate 10. In practicing this invention with the referenced substrate, it is preferred that the flat conductors thereon have a thickness of at least two mils, that is, consist of two ounce copper. It was found that if one ounce copper was used in practicing this invention with the referenced substrate, the thinner copper has a tendency to pull away from the substrate and thereby provide an unsatisfactory circuit module. For some applications the one ounce copper may be satisfactory. On the opposing side 16 of substrate 10 there are mounted a plurality of electrical components generally indicated by numeral 18.

Turning now to FIG. 1 the first process step 20 is to etch the circuit conductive pattern on the copper clad substrate. While this step is not a part of this invention, it is necessary in forming a circuit module. The next step 24 is to form grooves 22 in substrate 10. Such grooves are preferably formed on the substrate component side 16 and are elongated along and centered over the expected bend line 23. After the grooves are suitably formed, step 26 is performed by assembling the components onto the substrate while it is still flat. The circuit module is now ready for soldering, heating and bending.

Step 28 requires the operator to take the FIG. 2 illustrated assembly and place it in a solder bath (not shown) in the usual manner such that the conductor side 14 is barely immersed. This immersion solders the conductors to the assembled components. The solder bath being at +245° C. quickly heats the substrate 10 making it pliant at an elevated temperature. It has been found that the described assembly should not be placed in the bath for longer than eight seconds otherwise the substrate as described herein will become too soft for easy handling. Alternatively automatic soldering and fluxing machines, as well known to the trade, may be used.

The FIG. 2 assembly is then taken out of the solder bath and according to step 30 is bent along the line 23, forming the assembly illustrated in FIG. 3. When handling the FIG. 2 illustrated assembly at an elevated temperature, the reduced thickness portion between the bottom of groove 22 and side 14 is very pliant and subject to being torn. The conductor portions 38 were formed cross-wise with respect to grooves 22 and provide a stabilizing support making the reduced thickness portion more rigid. With the above mentioned substrate and copper clad conductive patterns it has been found that such conductor portions should constitute not less than 30% of the groove 22 length. With heavier crosswire conductor portions, the conductor portions may occupy a smaller percentage of the groove length; no limitation to the 30% figure is intended.

The FIG. 2 illustrated assembly is cooled according to step 40 forming a rigid circuit module as illustrated in FIG. 3. Base sheet-like portion 32 holds connector pins 74 for forming interconnections with other circuits. The two upstanding sheet-like portions 34 and 36 are formed at right angles to base portion 32 with their mounted components being closely spaced with respect to the base 32 mounted components. It is preferred that the bending be such that the opposing walls 42 of each of the grooves are in contact with each other such that little or no space remains therebetween along the respective lengths.

The completed bend of substrate 10 is best seen in FIG. 4 wherein numeral 10B indicates the substrate bend area. The grooved walls 42 are shown ideally abutting against each other. Solder 44 has been added to crosswise conductor portion 38 from the preceding soldering operation. From inspection of FIG. 4 it can be seen that the bend in portion 10B is quite strong.

Referring now to FIG. 5 various conductor patterns 12A are illustrated in a pair of boards 10A. Dotted lines 22A indicate grooves formed in boards 10A centered over the bend lines 23A. Crosswise conductor portions 38A occupy different proportions of the respective groove indicating lines 38A lengths. Boards 10A are provided as described hereinabove to form L-shaped circuit modules (not shown).

FIGS. 6 and 7 diagrammatically show another embodiment of the invention. A substrate 46 has a plurality of oppositely facing grooves 48, 50, 52 and 54. Opposite the grooves as shown are crosswise conductor portions 56, 58 and 60. In this embodiment conductor portion 58 is first placed in the solder bath for heating the bend portions adjacent the grooves 50 and 52 for forming a first set of two bends, generally indicated by numeral 62 in FIG. 7. Conductor portion 58 provides additional rigidity to the substrate 46 reduced thickness portions adjacent the grooves 50 and 52 during the just mentioned bending operation.

Outwardly facing sides 64 and 66 (FIG. 7) are formed in the substrate 46 as just formed, are then successively heated and bent at 68 and 70 to create the non-planar configuration illustrated in FIG. 7. Yet other configurations and combinations of grooves and crosswise conductor portions may be envisioned to successfully practice this invention.

Alternatively step 72 for reinforcing the bend area may be added to the FIG. 1 illustrated process. While it has been found that in most instances re-enforcement is not required, in certain circumstances it may be desired to apply a fillet of epoxy or other adhesive along the inner side of the groove walls 42 as at 75 (FIG. 4).

From inspection of FIG. 3 it is seen the provided circuit module has its mounted components arranged such that additional modules (not shown) may be placed in juxtaposition to provide a total component density somewhat greater than with flat or planar circuit modules.

Connector pins 74 may be added to the FIGS. 1 and 3 illustrated circuit module in any desired manner, such as by crimping, welding and soldering. Pins 74 may be inserted through apertures 76 during the herein described soldering operation. When so doing with a solder bath, the pins should have an upper end crimp or shoulder portion for engaging component surface 16 to prevent the pins from dropping through the apertures into the solder bath.

While rigid sheet materials have been described for substrate 10, it is to be understood that pliant materials may be also used. Such materials should become rigid when cooled after being subjected to elevated temperatures caused by the soldering process.

What is claimed is:

1. The method of circuit fabrication including in combination the following steps;

forming an elongated groove in one side of a sheet-like electrically insulating substrate which has the characteristics of becoming pliant at elevated temperature and has flat conductors on an opposing side to the formed grooved side which flat conductors include portions extending crosswise of the formed groove, the groove formation reducing the thickness of and extending entirely across the substrate, mounting components at least on the formed groove side of the substrate which components include leads engaging predetermined ones of said conductors, then immersing the conductor side of the substrate into a solder bath having an elevated temperature for soldering the conductors to said component leads and simultaneously heating the substrate to pliancy at least in the area of the formed groove, removing the substrate from the bath and then bending the heated substrate while still pliant in the area of the groove along the formed groove with the crosswise conductor portion adding stability to the substrate reduced thickness portion during said bending, and cooling the substrate.

2. The combination of claim 1 wherein said conductor portions extending crosswise to said groove are flat and have a thickness of at least 2 mils.

3. The combination of claim 1 wherein said solder bath has a temperature of about +245° C. and the immersion lasts no longer than 8 seconds.

4. The method of claim 3 further including a bending operation wherein the sides of the groove are caused to touch at the termination of the bending operation.

5. The method of claim 1 wherein the groove forming removes approximately 80% of the thickness of the substrate in the bend area and the bend results in approximately a 90° angle.

6. The method of claim 1 wherein there are at least two grooves formed which are mutually perpendicular and are formed on the same side of the substrate.

7. The method of claim 1 wherein said portions of said flat conductors extending crosswise of the formed groove have an aggregate dimension along the groove equal to not less than 30% of the groove length.

8. The method of claim 1 further including the step of applying an epoxy adhesive along the groove subsequent to cooling the substrate on the conductor side of the board.

References Cited

UNITED STATES PATENTS

| | | | |
|---|---|---|---|
| 2,880,378 | 3/1959 | Lindseth | 29—626 |
| 2,998,475 | 8/1961 | Grimsinger | 174—68.5 |
| 3,195,079 | 7/1965 | Burton et al. | 29—600 X |
| 3,196,522 | 7/1965 | Bernstein et al. | |
| 3,255,299 | 6/1966 | Hartsock | 29—625 X |

JOHN F. CAMPBELL, *Primary Examiner.*

ROBERT W. CHURCH, *Assistant Examiner.*

U.S. Cl. X.R.

317—101; 174—68.5; 339—17; 156—211